United States Patent [19]
Tai

[11] Patent Number: 5,710,738
[45] Date of Patent: Jan. 20, 1998

[54] LOW POWER DYNAMIC RANDOM ACCESS MEMORY

[75] Inventor: Jy-Der David Tai, Hsinchu, Taiwan

[73] Assignee: Powerchip Semiconductor Corp., Hsinchu, Taiwan

[21] Appl. No.: 768,983

[22] Filed: Dec. 17, 1996

[51] Int. Cl.$^6$ ................................................. G11C 7/00
[52] U.S. Cl. ............................................ 365/203; 365/202
[58] Field of Search ................................. 365/203, 149, 365/190, 194, 202

[56] References Cited

U.S. PATENT DOCUMENTS

| | | |
|---|---|---|
| 3,387,286 | 6/1968 | Dennard . |
| 5,062,079 | 10/1991 | Tsuchida ................. 365/210 |
| 5,177,708 | 1/1993 | Furutani ................. 365/203 |
| 5,243,574 | 9/1993 | Ikeda ................. 365/207 |
| 5,321,657 | 6/1994 | Arimoto ................. 365/203 |

*Primary Examiner*—David C. Nelms
*Assistant Examiner*—Son Mai
*Attorney, Agent, or Firm*—Ladas & Parry

[57] ABSTRACT

A low power dynamic random access memory (DRAM) is disclosed. The DRAM includes an equalization circuit connected to a pair of bitlines for allowing electric charge of the bitline having higher voltage to flow to the bitline having lower voltage. This equalization circuit is activated by a first precharge control signal. A delay circuit is used to generate a second precharge control signal, which is the delayed signal of the first precharge control signal. This precharge control circuit is connected to the bitlines and to a constant voltage source for setting the voltages on the bitlines to the voltage of the constant voltage source in response to the second precharge control signal. A sense amplifying circuit is connected to the pair of bitlines to amplify the voltages of the bitlines so that the voltage of one bitline is complementary to the voltage of the other bitline.

13 Claims, 4 Drawing Sheets

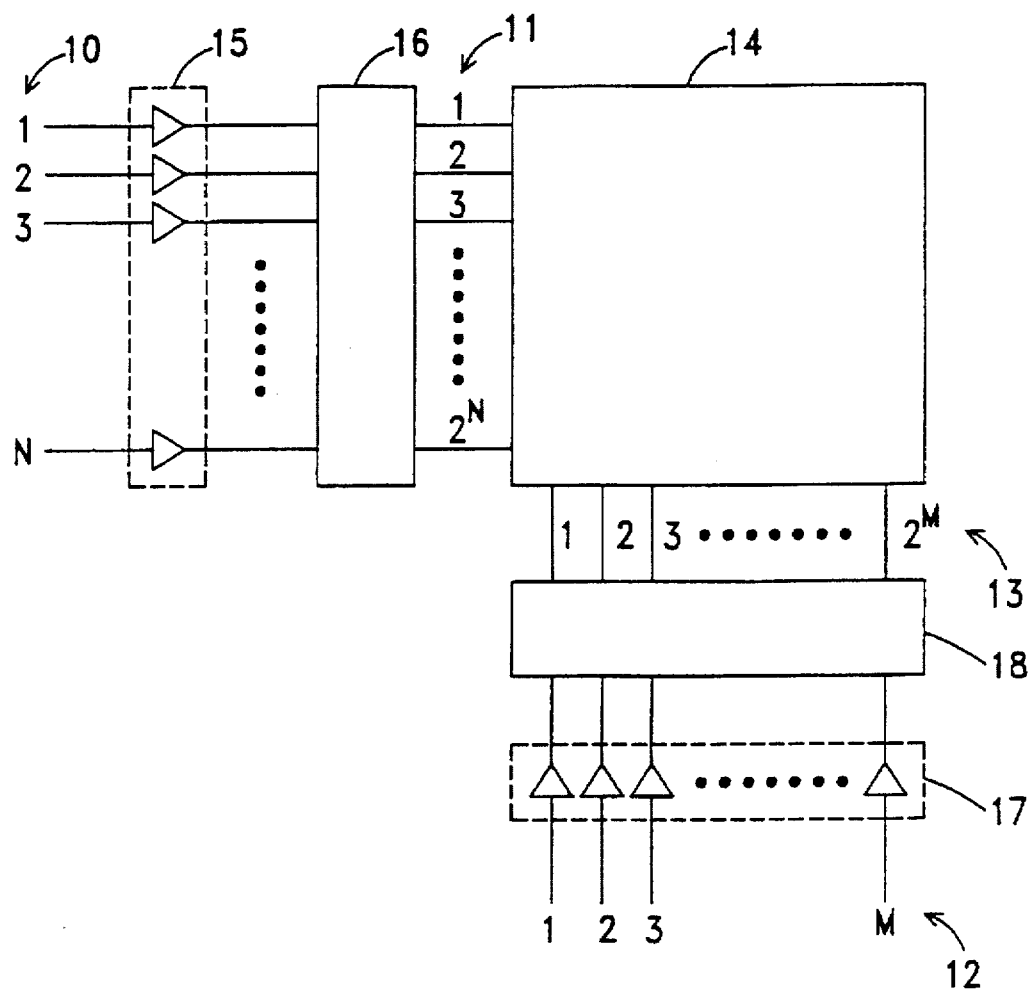
FIG.1
(Prior Art)
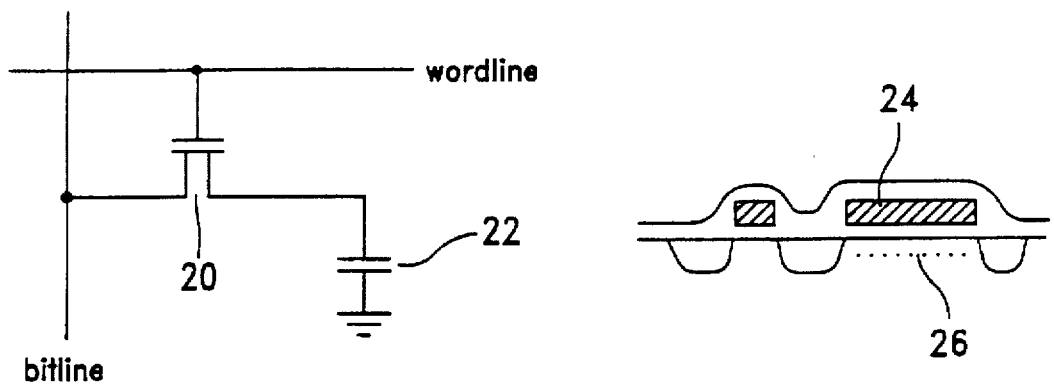
FIG.2A
(Prior Art)
FIG.2B
(Prior Art)

LOW POWER DYNAMIC RANDOM ACCESS MEMORY

BACKGROUND OF THE INVENTION

1. Field of the Invention

The present invention relates to a low power dynamic random access memory (DRAM), and particularly to a DRAM with a low power precharge circuit.

2. Description of the Prior Art

Recently, the demand for semiconductor devices, and particularly DRAM, has rapidly increased owing to the widespread use of digital equipment such as computers. FIG. 1 shows a simplified diagram of the organization of a DRAM. Typically, DRAMs comprise a large array of memory storage cells 14 which are arranged in an array including horizontal rows and vertical columns of cells. Horizontal lines (i.e. conductors) which connect all cells in a row are called wordlines 11, and vertical lines (also conductors) which connect all cells in a column are referred to as bitlines 13. Data flows into and out of the cells via those bitlines. Row addresses 10 and column addresses 12 are used to select the appropriate wordlines and bitlines, thus data to be written into or read out of the cells in a required order so far as external processors are concerned (but in a more or less random order from the perspective of the DRAM) can occur quickly and, if need be, at a fixed rate. A row address buffer 15 and a column address buffer 17 respectively receive row address signals 10 and column address signals 12, which are then used for selecting a storage cell in the memory 14. Further, a row decoder 16 and a column decoder 18 are added to decode the row address 10 and the column address 12 into the wordlines 11 and the bitlines 13 respectively, allowing fewer number of address lines been used for accessing a large number of storage cells in the memory 14. This array configuration of semiconductor memory cells lends itself well to the regular structure preferred in very large scale integration (VLSI) semiconductor fabrication industry.

Dynamic random access memory (DRAM) has become one of the most widely used types of semiconductor memory due to its low cost per bit, high device density and flexibility of use in data reading and writing operations.

U.S. Pat. No. 3,387,286 titled "Field Effect Transistor Memory" by R. H. Dennard describes a DRAM storage cell consisting of one transistor and one capacitor. A circuit schematic diagram of such structure is shown in FIG. 2A. The gate of the transistor 20 is controlled by a wordline signal, and data is written into or read out of the capacitor 22 along with a bitline signal. FIG. 2B shows cross section of a traditional one-transistor DRAM storage cell. A polysilicon layer 24 is used as one plate of the capacitor. The substrate region under the polysilicon plate 24 serves as the other electrode of the capacitor. A voltage is applied to invert this region, forming a depleted region below the substrate surface which is depicted as region 26 in FIG. 2B. In order to keep the memory cells of a same size (so that large numbers of cells can be arranged on a single semiconductor chip), the size of the capacitors is preferably kept small. As a result of the size constraints, and for other reasons as well, these capacitor typically have a small capacitance (i.e. they can only store a small amount of electrical charge).

FIG. 3 shows the structure of a memory cell array and the peripheral circuits required for reading and writing operations. Each memory cell 30 includes a capacitor 301 which holds a bit of data, and an access transistor 303 which serves as a switch. The gates of the access transistors which are arranged in the same row are connected to a common wordline $WL_x$, where $x=(1, 2, \ldots, n)$. The sources of the access transistors which are arranged in a column are alternately connected to a bitline pair $BL_x$, $BL_x/$, where $x=(1, 2, \ldots, m)$. One electrode of each capacitor 301 is connected to the drain of the corresponding access transistor 303, while the other electrode is connected to ground or a reference voltage.

Before the activation of a wordline and accessing of the memory array, a precharge circuit 32 charges all bitline pairs up to one half of the supply voltage, e.g., ½ Vdd. Further, each bitline pair is shorted or equalized so that the bitlines are at an equal potential. The time required to precharge and equalize is often referred to as precharge time or precharge period.

When a row address is supplied, it is decoded by a row decoder 34 into a row address signal and one wordline is activated corresponding to the decoded row address, thus turning on all the access transistors connected to this wordline. The storaged charges on all the capacitors corresponding to this wordline flow onto the bitline pairs. Owing to the relatively low capacitance of the capacitors used in the memory chip, a sense amplifier 36 is used to amplify the slight effects which the charged capacitor has on the bitline pair. The sense amplifier 36 draws the potential of lower-voltage bitline to Vss, and raises the potential of the other higher-voltage bitline up to Vdd. Only one of the amplified signals passes through an I/O gate circuit 37 corresponding to a decoded column address from a column decoder 38.

The precharge circuit 32 is disabled during memory access, that is, the precharge circuit 32 is disabled before wordline is enabled and it stays disabled until after sense amplifier is disabled. During memory access, the sense amplifier 36 forces one bitline to Vdd and the other bitline to Vss. At the end of memory access or when the sense amplifier 36 is disabled, the precharge circuit 32 is activated, forcing its corresponding bitlines to be charged from Vdd and Vss to half Vdd. Because the bitlines themselves have capacitance, the precharge of one bitline from Vdd to half Vdd requires discharge of the bitline to half Vdd. On the other side, precharge of the other bitline from Vss to half Vdd requires charging up of the bitline to half Vdd. An half Vdd voltage generator is used to provide half Vdd voltage for precharging the bitlines. Since there are typically 1024 columns in one sub-array block in most of the present 16 Meg DRAM designs, charging and discharging the bitlines takes, in comparative terms, a lot of power from the half Vdd voltage generator and also creates much electrical noise when all the columns in one sub-array block are precharged at once.

FIG. 4 shows a conventional precharge/sense amplifier, where three transistors 40, 42 and 44 are used for each column to precharge the bitline pair BL, BL/. Signal VBL, the half Vdd constant voltage source, forces bitline pair BL, BL/ to half Vdd whenever a precharge control signal PRE turns on transistors 42 and 44. The third transistor 40, a so-called equalizer, is also turned on and is used to balance or short the bitline pair BL, BL/ together during the precharge period.

For the following discussion, it is assumed that bitline BL has low voltage and bitline BL/ has high voltage. When signal PRE climbs above the threshold voltage of an N metal-oxide-semiconductor (NMOS) transistor, transistor 42 is turned on and voltage source VBL subsequently precharges the low-voltage bitline BL. In the meantime, the high-voltage bitline BL/ tends to share its charge with the bitline BL since transistor 40 is also turned on at this time. When the voltage of the signal PRE is one threshold voltage higher than that of the voltage source VBL, the transistor 44 is turned on and the high-voltage bitline BL/ discharges to voltage source VBL. Current flowing from and to the voltage source VBL consumes a large amount of the power provided by the voltage source VBL. Further, much noise is introduced due to the charging and discharging which occurs in this circuit.

SUMMARY OF THE INVENTION

In accordance with the present invention, a circuit is provided for forming a DRAM that substantially saves power. In one embodiment, the DRAM includes an equalization circuit connected to a pair of bitlines for allowing electric charge of the bitline having higher voltage to flow to the bitline having lower voltage. This equalization circuit is activated by a first precharge control signal. A delay circuit is used to generate a second precharge control signal, which is the delayed signal of the first precharge control signal. This precharge control circuit is connected to the bitlines and to a constant voltage source for setting the voltages on the bitlines to the voltage of the constant voltage source in response to the second precharge control signal. A sense amplifying circuit is connected to the pair of bitlines to amplify the voltages of the bitlines so that the voltage of one bitline is complementary to the voltage of the other bitline.

BRIEF DESCRIPTION OF THE DRAWINGS

FIG. 1 shows a simplified diagram of the organization of large semiconductor memories.

FIG. 2A shows a circuit schematic diagram of a dynamic random access memory (DRAM) cell.

FIG. 2B shows cross section of a traditional one-transistor DRAM storage cell.

DESCRIPTION OF THE PREFERRED EMBODIMENT

Figure 5A:
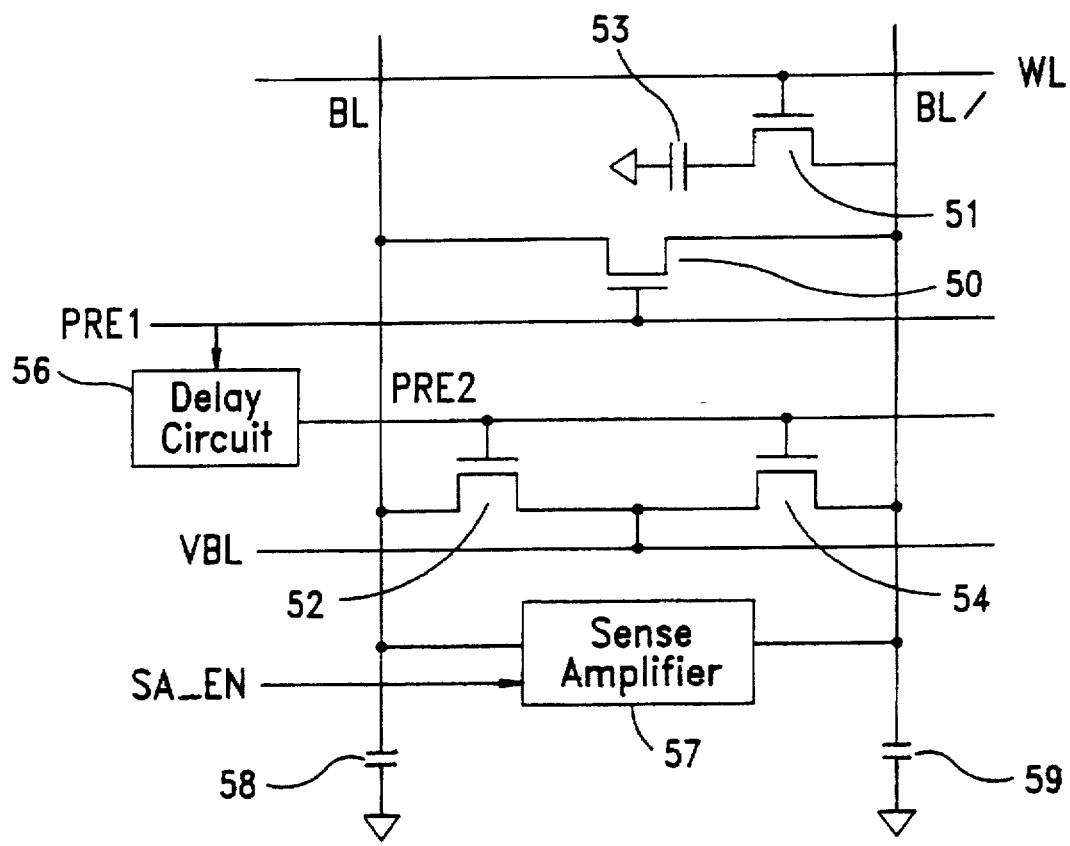
FIG. 5A shows one embodiment of the present invention.
Figure 5B:
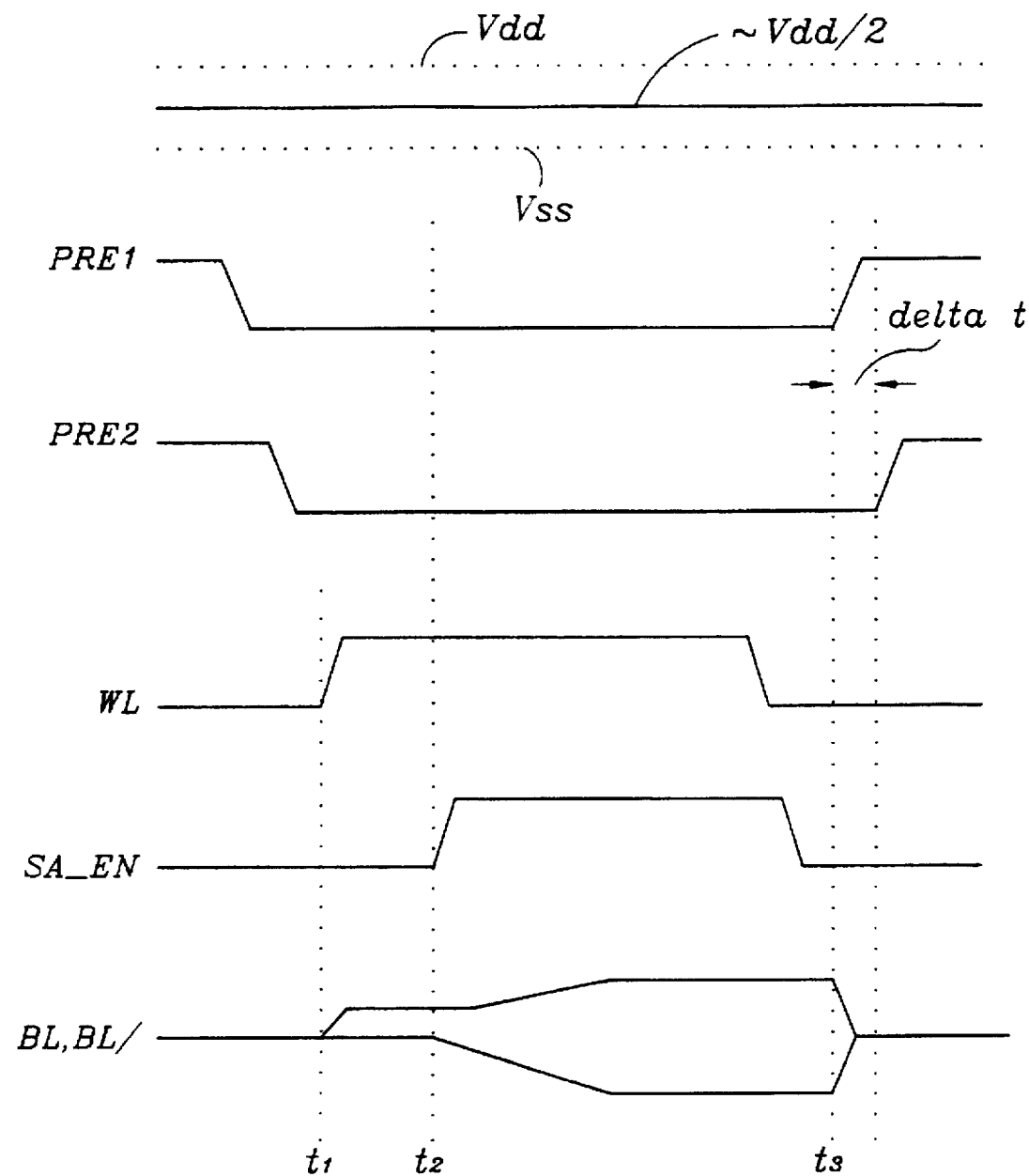
FIG. 5B shows the timing diagram according to the embodiment of the present invention.
Figure 6:
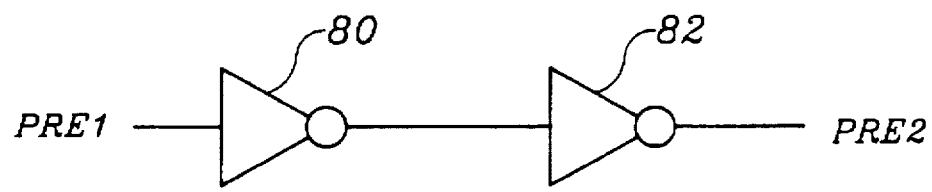
FIG. 6 shows one implementation of the delay circuit in the present invention.

FIG. 5A shows one embodiment of the present invention. A corresponding timing diagram is shown in FIG. 5B. A delay circuit 56 generates a delayed precharge control signal PRE2 based upon an original precharge control signal PRE1. This delay circuit 56 can be implemented conventionally with inverter pairs, and one implementation or embodiment is shown in FIG. 6 where two inverter 80 and 82 are connected serially. The number of inverter pairs selected depends on the amount of delay required for the particular DRAM.

A wordline control signal WL from a row decoder becomes active (goes high) at time t1, as is shown by FIG. 5B, when it corresponds to a selected row address, thereby turning on an access transistor 51. Consequently, charge stored on capacitor 53 flows onto the bitline BL/. Owing to the low capacity of the capacitor 53 in the high density memory chip, the slightly charged potential of the bitline pair is then amplified by a sense amplifier 57 activated by a sense amplifier enable signal SA_EN beginning at time t2. The sense amplifier 57 draws the potential of one bitline to Vss, and raises the potential of the other bitline up to Vdd, thus completing a memory access period.

Transistor 50, which is referred to as a dumper or an equalizer, is turned on at time t3 by an active precharge control signal PRE1 at the beginning of a precharge cycle, thus allowing charge on the high-voltage bitline to flow to the low-voltage bitline. The charge conventionally flowing in and from the voltage source VBL used in conventional circuits does not exist, but the charge is instead recycled. Also, since the parasitic capacitances 58, 59 occurring due to bitline pair BL and BL/ are ideally the same, the resultant potential on both bitlines BL and BL/ is about half Vdd.

Figure 3:
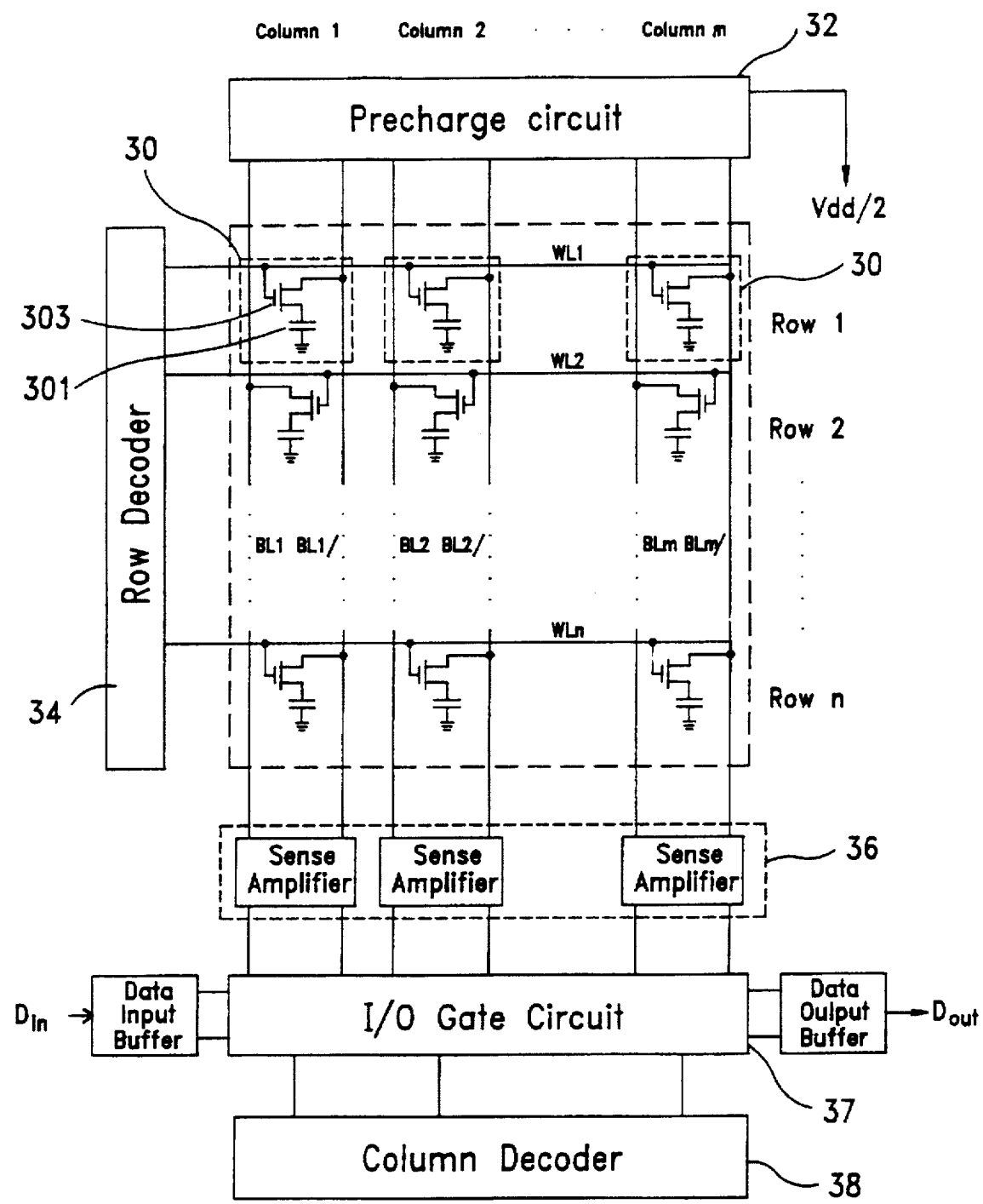
FIG. 3 shows the structure of a memory cell array and the peripherals.
Figure 4:
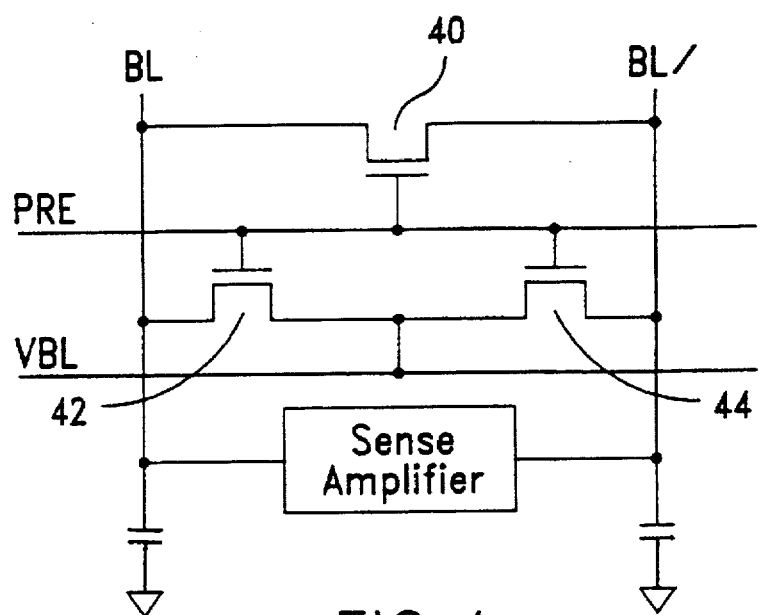
FIG. 4 shows a conventional precharge/sense amplifier.

After delay delta t of the delay circuit 56, transistors 52 and 54 are turned on by the delayed precharge control signal PRE2, thus causing the potential on the bitline pair BL and BL/ to be at haft Vdd and also avoiding the potential on the bitline pair BL and BL/ from drifting away. Because the potential on the bitline pair BL and BL/ tends to stay at half Vdd, voltage source VBL almost delivers no power to the bitlines BL and BL/, comparing with the relatively large power consumption caused by charging and discharging through transistors 42 and 44 in a conventional precharge circuit of FIG. 4.

Although specific embodiments have been illustrated and described it will be obvious to those skilled in the art that various modification may be made without departing from the spirit which is intended to be limited solely by the appended claims.

What is claimed is:

1. A low power dynamic random access memory having a plurality of memory cells therein, said random access memory comprising:

equalization means connected to a pair of bitlines for allowing electric charge on the bitline having higher voltage to flow to the bitline having lower voltage, said equalization means being activated by a first precharge control signal;

delay means for generating a second precharge control signal, said second precharge control signal being delayed compared to the first precharge control signal;

precharge control means connected to the pair of bitlines and to a constant voltage source for setting the voltages on the bitlines to the voltage of the constant voltage source in response to the second precharge control signal; and sense amplifying means connected to the pair of bitlines for amplifying the voltages of the bitlines so that the voltage of one bitline is complementary to the voltage of the other bitline.

2. The low power dynamic random access memory according to claim 1, wherein said equalization means comprises a field effect transistor, gate electrode of said first field effect transistor being connected to the first precharge control signal.

3. The low power dynamic random access memory according to claim 1, wherein said delay means comprises a plurality of even number of inverters connected in serial.

4. The low power dynamic random access memory according to claim 1, wherein said delay means comprises two inverters connected in serial.

5. The low power dynamic random access memory according to claim 1, wherein said precharge control means comprises a second field effect transistor and a third field effect transistor, with gate electrodes of the second field effect transistor and the third field effect transistor being connected to the second precharge control signal and wherein a source electrode of the second field effect transistor and a drain electrode of the third field effect transistor are connected to the constant voltage source.

6. The low power dynamic random access memory according to claim 1, further comprising an enable signal inputting to and activating said sense amplifying means, said sense amplifying means being deactivated before the response to the first precharge control signal of the precharge control means.

7. The low power dynamic random access memory according to claim 1, wherein source electrode of said memory cell is connected to one of the bitlines, and gate electrode of said memory cell is connected to a wordline.

8. A low power dynamic random access memory having a plurality of memory cells therein, said random access memory comprising:

- a first field effect transistor connected to a pair of bitlines for allowing electric charge of the bitline having higher voltage to flow to the bitline having lower voltage, said first field effect transistor being activated by a first precharge control signal;
- a plurality of even number of serially coupled inverters for generating a second precharge control signal from the first precharge control signal;
- a precharge control circuit comprising a second field effect transistor and a third field effect transistor connected to the pair of bitlines and to a constant voltage source for setting the voltages on the bitlines to the voltage of the constant voltage source in response to the second precharge control signal; and
- a sense amplifier connected to the pair of bitlines for amplifying the voltages on the bitlines.

9. The low power dynamic random access memory according to claim 8, wherein a gate electrode of said first field effect transistor is connected to the first precharge control signal.

10. The low power dynamic random access memory according to claim 8, wherein said plurality of even number of inverters comprise two inverters connected in serial.

11. The low power dynamic random access memory according to claim 8, wherein gate electrodes of the second field effect transistor and the third field effect transistor are connected to the second precharge control signal and wherein a source electrode of the second field effect transistor and a drain electrode of the third field effect transistor are connected to the constant voltage source.

12. The low power dynamic random access memory according to claim 8, further comprising an enable signal inputting to and activating said sense amplifier, said sense amplifier being deactivated before the response to the first precharge control signal of the precharge control circuit.

13. The low power dynamic random access memory according to claim 8, wherein source electrode of said memory cell is connected to one of the bitlines, and gate electrode of said memory cell is connected to a wordline.

\* \* \* \* \*